United States Patent
Waddell (10) Patent No.: US 9,452,409 B2
(45) Date of Patent: Sep. 27, 2016

(54) PARA-HYDROGEN POLARIZER

(75) Inventor: Kevin W. Waddell, Hendersonville, TN (US)

(73) Assignee: VANDERBILT UNIVERSITY, Nashville, TN (US)

( * ) Notice: Subject to any disclaimer, the term of this patent is extended or adjusted under 35 U.S.C. 154(b) by 112 days.

(21) Appl. No.: 14/113,325

(22) PCT Filed: Apr. 22, 2012

(86) PCT No.: PCT/US2012/034603
§ 371 (c)(1),
(2), (4) Date: Oct. 22, 2013

(87) PCT Pub. No.: WO2012/145733
PCT Pub. Date: Oct. 26, 2012

(65) Prior Publication Data
US 2014/0034481 A1    Feb. 6, 2014

Related U.S. Application Data (60) Provisional application No. 61/478,193, filed on Apr. 22, 2011.

(51) Int. Cl.
*B01J 19/08* (2006.01)
*G01R 33/28* (2006.01)

(52) U.S. Cl.
CPC ............ *B01J 19/087* (2013.01); *G01R 33/282* (2013.01)

(58) Field of Classification Search
CPC ........................... B01J 19/087; G01R 33/282
USPC ............. 422/186.01, 186–187; 251/62–63.5; 204/155, 157.2
See application file for complete search history.

(56) References Cited

U.S. PATENT DOCUMENTS

| | | | | |
|---|---|---|---|---|
| 2,656,847 A | * | 10/1953 | Collins | F16L 39/04 251/63 |
| 2,660,559 A | * | 11/1953 | Prime | 422/186.08 |
| 2,937,634 A | | 5/1960 | Kelseaux et al. | |
| 3,043,110 A | | 7/1962 | Ahern | |
| 3,090,672 A | | 5/1963 | Grotthuss et al. | |
| 3,098,732 A | | 7/1963 | Dennis | |
| 3,115,329 A | * | 12/1963 | Wing | F16K 31/363 251/175 |
| 3,380,809 A | | 4/1968 | Newton | |
| 3,387,496 A | * | 6/1968 | Broerman | G01N 30/20 251/62 |
| 3,389,555 A | | 6/1968 | Goldstein et al. | |

(Continued)

FOREIGN PATENT DOCUMENTS

| WO | WO 2009/129265 | 10/2009 |
|---|---|---|
| WO | WO 2012/145733 | 10/2012 |

OTHER PUBLICATIONS

Albers, Cancer Res. 2008. vol. 68(20), pp. 8607-8615.
(Continued)

*Primary Examiner* — Keith Hendricks
*Assistant Examiner* — Colleen M Raphael
(74) *Attorney, Agent, or Firm* — Michael Best & Friedrich LLP (57) ABSTRACT

A reactor assembly comprising a reservoir, a reaction chamber, and a valve assembly comprising at least one valve. The reservoir, reaction chamber, and valve assembly are non-magnetic. The valve assembly is adapted to selectively provide fluid communication between the reservoir and the reaction chamber.

12 Claims, 8 Drawing Sheets

(56) References Cited

U.S. PATENT DOCUMENTS

| | | | |
|---|---|---|---|
| 3,439,288 A | 4/1969 | Mangin | |
| 3,479,608 A | 11/1969 | Ehrlich | |
| 3,645,799 A | 2/1972 | Goue et al. | |
| 3,650,994 A | 3/1972 | Booth | |
| 3,815,043 A | 6/1974 | Carman, Jr. et al. | |
| 3,992,167 A | 11/1976 | Beddome | |
| 4,240,469 A * | 12/1980 | Bauer | F16K 11/065 251/175 |
| 4,245,171 A | 1/1981 | Rabinowitz et al. | |
| 4,278,902 A | 7/1981 | Loy et al. | |
| 4,309,511 A | 1/1982 | Jefferson et al. | |
| 4,361,770 A | 11/1982 | Rabinowitz et al. | |
| 4,393,039 A | 7/1983 | Sherman | |
| 4,508,119 A | 4/1985 | Tukamoto | |
| 4,642,206 A | 2/1987 | Honig | |
| 4,644,746 A | 2/1987 | Hartman | |
| 4,784,450 A | 11/1988 | Jain et al. | |
| 4,829,785 A | 5/1989 | Hersey | |
| 4,990,412 A | 2/1991 | Hersey | |
| 5,011,584 A | 4/1991 | Godfried | |
| 5,193,095 A | 3/1993 | Tashiro et al. | |
| 5,493,629 A | 2/1996 | Stange | |
| 5,504,765 A | 4/1996 | Miyamoto et al. | |
| 5,580,793 A | 12/1996 | Wanner | |
| 5,640,997 A * | 6/1997 | Reed | F16K 3/34 251/207 |
| 5,934,103 A | 8/1999 | Ryan et al. | |
| 6,126,794 A | 10/2000 | Chambers | |
| 6,379,625 B1 * | 4/2002 | Zuk, Jr. | 422/186.01 |
| 6,419,815 B1 | 7/2002 | Chambers | |
| 6,467,751 B1 * | 10/2002 | Korpanty | F16K 15/20 251/294 |
| 6,574,495 B1 | 6/2003 | Golman et al. | |
| 6,574,496 B1 | 6/2003 | Golman et al. | |
| 6,611,335 B1 | 8/2003 | Hovde | |
| 6,666,047 B1 * | 12/2003 | Shah et al. | 600/420 |
| 6,748,349 B1 | 6/2004 | Majumdar et al. | |
| 6,790,324 B2 | 9/2004 | Chambers | |
| 6,890,410 B2 | 5/2005 | Sullivan | |
| 7,221,448 B1 * | 5/2007 | Appelt et al. | 422/50 |
| 7,251,519 B2 | 7/2007 | Axelsson et al. | |
| 7,410,557 B2 | 8/2008 | Kitada et al. | |
| 7,474,095 B2 | 1/2009 | Levitt et al. | |
| 7,541,806 B2 | 6/2009 | Appelt et al. | |
| 7,573,264 B2 | 8/2009 | Xu et al. | |
| 7,701,218 B2 | 4/2010 | Noonan et al. | |
| 7,750,633 B2 | 7/2010 | Pines et al. | |
| 7,805,981 B2 | 10/2010 | Kadlecek et al. | |
| 2002/0074064 A1 | 6/2002 | Kane | |
| 2002/0112479 A1 | 8/2002 | Keefer et al. | |
| 2002/0179453 A1 | 12/2002 | Chambers | |
| 2003/0124732 A1 | 7/2003 | Axelsson et al. | |
| 2004/0024307 A1 | 2/2004 | Golman et al. | |
| 2004/0108203 A1 | 6/2004 | Sullivan | |
| 2004/0182551 A1 | 9/2004 | Zhou et al. | |
| 2004/0203166 A1 | 10/2004 | Sullivan | |
| 2005/0001615 A1 * | 1/2005 | Sato | G01R 33/282 324/306 |
| 2005/0058875 A1 | 3/2005 | Jerome | |
| 2005/0170331 A1 | 8/2005 | Lerche et al. | |
| 2005/0274607 A1 | 12/2005 | Kitada et al. | |
| 2006/0104906 A1 | 5/2006 | Ardenkjaer-Larsen et al. | |
| 2006/0127313 A1 * | 6/2006 | Goldman | G01R 33/282 424/9.3 |
| 2006/0127314 A1 | 6/2006 | Ardenkjaer-Larsen et al. | |
| 2006/0173283 A1 | 8/2006 | Axelsson et al. | |
| 2006/0280993 A1 | 12/2006 | Keefer et al. | |
| 2007/0063700 A1 | 3/2007 | Levitt et al. | |
| 2007/0144523 A1 | 6/2007 | Bolam et al. | |
| 2007/0296412 A1 | 12/2007 | Appelt et al. | |
| 2008/0175780 A1 | 7/2008 | Pez et al. | |
| 2008/0236250 A1 | 10/2008 | Kadlecek et al. | |
| 2008/0287774 A1 | 11/2008 | Katz-Brull | |
| 2009/0007594 A1 | 1/2009 | Dylla | |
| 2009/0016964 A1 | 1/2009 | Kalechofsky et al. | |
| 2009/0128147 A1 | 5/2009 | Slade | |
| 2009/0134868 A1 | 5/2009 | Noonan et al. | |
| 2009/0162287 A1 | 6/2009 | Lerche et al. | |
| 2009/0261826 A1 | 10/2009 | Pines et al. | |
| 2009/0264732 A1 | 10/2009 | Ross et al. | |
| 2009/0283176 A1 | 11/2009 | Berry et al. | |
| 2009/0323732 A1 | 12/2009 | Benabid | |
| 2010/0011813 A1 | 1/2010 | Inoue et al. | |
| 2010/0015038 A1 | 1/2010 | Inoue et al. | |
| 2010/0092391 A1 | 4/2010 | Ross et al. | |
| 2010/0126435 A1 | 5/2010 | Roth et al. | |
| 2010/0133279 A1 | 6/2010 | Berry et al. | |
| 2010/0178249 A1 | 7/2010 | Brindle et al. | |
| 2010/0196283 A1 | 8/2010 | Lerche et al. | |
| 2010/0219826 A1 | 9/2010 | Duckett et al. | |
| 2010/0226859 A1 | 9/2010 | Brindle et al. | |
| 2010/0233089 A1 | 9/2010 | Ross et al. | |
| 2010/0301853 A1 | 12/2010 | Happer et al. | |
| 2010/0310467 A1 | 12/2010 | Gisselsson et al. | |
| 2014/0034481 A1 | 2/2014 | Waddell | |

OTHER PUBLICATIONS

Andrews et al., "Simple ortho-para hydrogen and para-ortho deuterium converter for matrix isolation spectroscopy," Review of Scientific Instruments, 2004, vol. 75, No. 9, 3039-3044.
Bargon et al., "Boosting the Sensitivity of NMR Spectroscopy using Parahydrogen," Research Matters, 2000.
Bonhoeffer et al., Phys Chem. 1929, vol. B4, pp. 113.
Bowers et al., J Am Chem Soc. 1987, vol. 109(18), pp. 5541-5542.
Bowers, Phys. Rev. Lett. 1986. 57, pp. 2645-2648.
Day, Nature Medicine. 2007. vol. 13(11), pp. 1382-1387.
Duckett et al., "Application of the parahydrogen phenomenon: A chemical perspective," Journal of Progress in Nuclear Magnetic Spectroscopy 34, 1999, 71-92.
Gamliel et al., "An Apparatus for Production of Isotopically and Spin-Enriched Hydrogen for Induced Polarization Studies," Appl Magn Reson, 2010, 39:329-345.
Goldman, Cancer Res. 2006, vol. 66(22), pp. 10855-10860.
Hovener et al. Pasadena hyperpolarization of C13 biomolecules: equipment design and installation MAGMA; 22(2): 111-121. Apr. 2009, p. 1, 3, 11, 12.
International Search Report and Written Opinion for Application No. PCT/US2012/034603 dated Apr. 22, 2012 (10 pages).
Norton, Efficient Generation of Hyperpolarized Molecules Utilizing the Scalar Order of Parahydrogen, Thesis [online], May 11, 2010 http://thesis.library.caltech.edu/5824/1/thesis_VAN.pdf> pp. 4, 21,66-68.
Tam et al., Rev Sci Instrum. 1999, vol. 70, pp. 1926.
Tom et al., "Producing and quantifying enriched para-H2," Review of Scientific Instruments 80, 016108, 2009, 1-3.

* cited by examiner

PARA-HYDROGEN POLARIZER

CROSS-REFERENCE TO RELATED APPLICATIONS

This patent application is a national stage filing under 35 U.S.C. 371 of International Application No. PCT/US2012/034603 claims priority to U.S. Provisional Patent Application No. 61/478,193 filed Apr. 22, 2011, the disclosures of which are incorporated herein by reference in their entireties. Priority to each application is hereby claimed.

GOVERNMENT LICENSE RIGHTS

This invention was made with government support from a National Cancer Institutes P50 ICMIC (In Vivo Cellular and Molecular Imaging) career award with center number 1-04-065-9043. The United States federal government has certain rights in the invention.

INTRODUCTION

The production of para-hydrogen-enriched compositions is essential to a diverse array of scientific endeavors. For example, para-hydrogen-enriched compositions have found uses in biomedical applications of magnetic resonance.

Methods to polarize nuclear magnetic moments have been known for several years and are now emerging as valuable diagnostic tools in biomedicine. For example, dynamic nuclear polarization ("DNP") has enabled detection, grading, and monitoring of response to therapy in vivo in cancer cells (Goldman, Cancer Res. 2006, Volume 66(22), pp 10855-10860; Albers. Cancer Res. 2008. Volume 68(20), pp 8607-8615; Day. Nature Medicine. 2007. Volume 13(11), pp 1382-1387). Catalytic addition with the singlet spin-isomer of hydrogen (Bowers. Phys. Rev. Lett. 1986. Volume 57, pp 2645-2648), referred to as PASADENA, should be similarly useful, but is currently less widespread in biomedical imaging. Fast chemistry (i.e., catalytic hydrogenation) must be coordinated with nuclear magnetic manipulations in PASADENA. Hence, molecules which can be saturated to yield useful contrast agents are required, but not yet widely available.

Optimal procedures for filtering spin-isotopes of hydrogen to high enrichment along with relaxation properties on a variety of surfaces was reported before 1980, and Weitekamp and Bowers discovered a method to utilize para-hydrogen for enhancing nuclear magnetic resonance sensitivity (Bowers C R, Weitekamp D P. Phys Rev Lett, 1986, Volume 57, pp 2645-48; Bowers C R, Weitekamp D P. J Am Chem Soc. 1987, Volume 109(18), pp 5541-5542). This application, coined PASADENA ("parahydrogen and synthesis allow dramatic enhancement of nuclear alignment"), uses catalyzed reduction of unsaturated bonds by para-hydrogen to prepare molecules with polarized spins.

Significant enhancements of NMR sensitivity have been demonstrated with para-hydrogen technologies, and the overall methodology has been validated in a variety of basic science and pilot pre-clinical studies. Previously reported experimental results from para-hydrogen polarization experiments suffered from poor reproducibility due to the reliance on custom polarizer configurations. For example, the sensitivity enhancement achieved in para-hydrogen induced polarization experiments may depend strongly on the relative timings between chemical reaction and nuclear magnetic transformations, or on the pressure and temperature at which the hydrogenation is carried out. In a typical experiment, reactant molecules stored under inert conditions are subsequently shuttled to reaction chambers for hydrogenation and nuclear magnetic transformations. At an empirically-optimized delay from the introduction of reactant molecules, polarization transfer or detection is required, respectively, to preserve or to measure the hydrogenated substance, depending on whether the desired application is biomedical contrast or basic science.

Integrated systems, referred to as pulse programmers, are specialized instruments which enable radiofrequency, gradient, and acquisition events to be controlled precisely in nuclear magnetic resonance ("MR") experiments. Given these attributes and the favorability of PASADENA at field strengths down to a few mT, low-field MR consoles are well-suited for consolidating experimental variables in pulse-programmable codes that can be easily reported and shared among end-users.

Generally, a PASADENA polarizer includes a flow-based circulatory system for selectively and rapidly delivering gaseous and liquid reactants and/or reaction products to/from various reservoirs and reactors, where high-pressure valves are required to direct the rapid flow of reactants and/or products. An electronic controller, or switching network, controls the operation of the various components of the polarizer, including the valves. Ideal circulatory systems would have minimal dead-volume (i.e., volume between a reservoir and a reactor), so as to reduce the likelihood of contacting a contaminated surface, and to limit the amount of expensive reagents needed to be injected into and through the circulatory system. When molecules encounter increased surface area in transit between an isolated reservoir and a reactor, performance decreases while system response latency increases with inefficiency. Under these circumstances, expensive catalyst and reactants may be distributed across the apparatus, and the experiment meant for the reactor is smeared across the innards of the apparatus.

In prior implementations of PASADENA polarizers, solenoid valves were used to direct fluid-flow through the circulatory system, because they can be operated at the high pressures necessary for the rapid delivery and efficient reaction of fluid reactants with gaseous para-hydrogen. Solenoid valves use electrical current to generate magnetic fields for actuating metallic plungers. Exposing polarized chemicals to the magnetic fields generated by the components of a solenoid valve may adversely affect the polarization of the chemicals. Moreover, when in close proximity to the extremely strong magnetic fields generated by a PASADENA polarizer, solenoid valves do not function properly, and in any event pose a projectile hazard. To prevent the solenoid valves from being affected by the magnetic fields of the polarizer, the solenoid valves, and thus the reactant reservoirs, must be located at a significant distance from the polarizer, and specifically, outside the static and applied magnetic fields produced by the polarizer. This causes an incidental need for substantial dead-volume between the reactant reservoirs and the reactors that are positioned within the magnetic fields, and as discussed above, greater dead-volume can be problematic and lead to a time-dependent degradation of polarizer performance. Another problem associated with having reactant reservoirs at a distance from the static fields is that equilibrium polarizations of long-lived nuclei used for storing para-hydrogen polarization do not have time to develop when rapidly shuttled from outside the field to within the reactor, or alternatively can induce unwanted nuclear magnetic resonant transformations.

SUMMARY

This disclosure provides reactor assemblies comprising a reservoir, a reaction chamber, and a valve assembly comprising at least one valve. The reservoir, reaction chamber, and valve assembly are non-magnetic. The valve assembly is adapted to selectively provide fluid communication between the reservoir and the reaction chamber. In some embodiments, the reactor assembly further may comprise a magnet adapted to produce a static magnetic field having a magnitude of at least about 1 mT and a radiofrequency pulse generator adapted to produce an applied magnetic field, where the reaction chamber is positioned within the magnetic field when the radiofrequency pulse generator is producing the applied magnetic field, and the reservoir, reaction chamber, and valve assembly are positioned within the static magnetic field when the magnet is producing the static magnetic field. In some embodiments, the at least one valve may comprise a spool valve.

In some embodiments, the valve may comprise a housing and a piston assembly, where the piston assembly translates axially within the housing having an inner wall defining an internal space and a piston assembly positioned within the space and movable relative to the housing between a first position and a second position. In some embodiments, the housing may comprise a first opening at a first end and a second opening at a second end opposite the first end. In some embodiments, the piston assembly translates to the first position in response to a first fluid pressure applied via the first opening and the piston assembly translates to a second position in response to a second fluid pressure applied via the second opening.

In some embodiments, the housing further may comprise a third opening in fluid communication with the reaction chamber and a fourth opening in fluid communication with the reservoir, wherein the third opening and fourth opening are located in the side of the housing. In some embodiments, the piston assembly may be adapted to provide fluid communication between the third opening and fourth opening when the piston assembly is in the first position and may be adapted to prevent fluid communication between the third opening and fourth opening when the piston assembly is in the second position.

In some embodiments, the housing further may comprise a fifth opening in fluid communication with an external source or an output and a sixth opening in fluid communication with the reaction chamber, wherein the fifth opening and sixth opening are located in the side of the housing. In some embodiments, the piston assembly may be adapted to prevent fluid communication between the fifth opening and sixth opening when the piston assembly is in the first position and may be adapted to provide fluid communication between the fifth opening and sixth opening when the piston assembly is in the second position.

In some embodiments, the piston assembly further may comprise a first end, a second end, a channel and at least one sealing member on each side of the channel, wherein each sealing member is adapted to prevent or inhibit fluids from flowing between the sealing member and the inner wall of the housing when a net compressive force is applied to the first and second ends of the piston assembly. For example, the application of a net compressive force to the first and second ends may cause at least a portion of each sealing member to move towards the inner wall of the housing. Each sealing member may engage the inner wall of the housing with a force having a magnitude that is proportional to the magnitude of the compressive force applied to the first and second ends. Moreover, during translation of the piston assembly between the first and second position, the at least one sealing member may engage the inner wall of the housing with sufficient force to wipe liquids from the inner wall of the housing, but with insufficient force to prevent translation of the piston assembly.

This disclosure also provides methods of preparing contrast agents, the methods comprising: a) generating a static magnetic field of at least 1 mT from a magnet; b) selectively delivering a first reactant to a reaction chamber via a valve assembly comprising at least one valve; c) selectively delivering a second reactant to the reaction chamber from a reservoir via the valve assembly; d) applying a resonant, radiofrequency decoupling field to the contents of the reaction chamber; and e) evacuating the contents of the reaction chamber via the valve assembly; where the reservoir, reaction chamber, and valve assembly are non-magnetic and are positioned within the magnetic field.

DETAILED DESCRIPTION

This disclosure provides reactor assemblies that can be used, for example, to efficiently prepare magnetically polarized compositions including, but not limited to, para-hydrogen-enriched compositions that may be used as contrast agents. The reactor assemblies include nonmagnetic reservoirs, reaction chambers and/or valve assemblies that enable reactants to be efficiently stored, mixed, and reacted in close proximity to, or within, NMR magnetic fields. Specifically, and in contrast to conventional polarizers, the reactant reservoirs, reaction chambers and/or valve assemblies each may be positioned within a static magnetic field, thereby permitting the use of substantially less conduit (i.e. dead-volume) between the reactant reservoirs and reaction chamber. The non-magnetic valve assemblies may include one or more valves configured to withstand pressures of at least about 500 psi, which are commonly achieved when rapidly delivering reactants to a reaction chamber in a polarizer, such as pressures of at least about 600 psi, 700 psi, 800 psi, 900 psi, or 1000 psi, among others.

Figure 1:
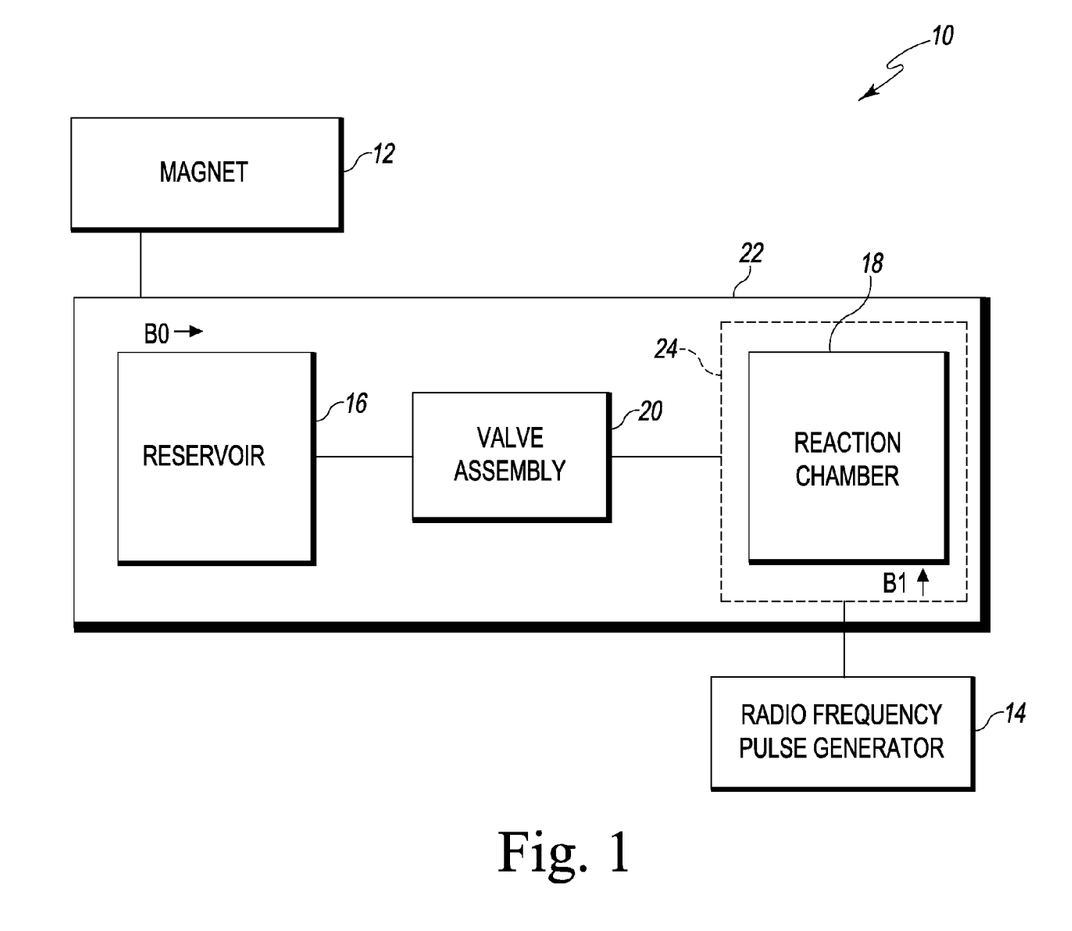
FIG. 1 is a block diagram generally showing reactor assemblies according to this disclosure.

FIG. 1 generally shows a reactor assembly 10. The reactor assembly 10 may include a magnet 12, a radiofrequency (RF) pulse generator 14, a reservoir 16, a reaction chamber 18, and a valve assembly 20. The magnet 12 may be adapted to produce a static magnetic field (B0) within an area 22, and may comprise any suitable material or components consistent with this function. The magnet 12 may be any type of magnet suitable for use in nuclear magnetic resonance experiments, or in pre-clinical or clinical imaging systems. The magnet may be capable of permanently or selectively producing a static magnetic field (B0) having any desired direction and magnitude, such as a magnitude between about 1 mT and about 20 T. For example, MRI scanners generate magnetic fields between about 0.3 T and about 3 T, whereas high field NMR magnets can produce magnetic fields upwards of 20 T. Exemplary magnets may include, but are not limited to, permanent magnets, electromagnets and superconductive solenoids, among others. As discussed below, magnets capable of selectively producing a static magnetic field (B0), such as electromagnets and solenoids, may be activated or deactivated by a controller.

The RF pulse generator 14 may be adapted to provide an applied magnetic field (B1) within an area 24, and may comprise any suitable components consistent with this function. The RF pulse generator 14 may be any known or hereinafter devised RF pulse generator capable of producing applied magnetic fields suitable for use in nuclear magnetic resonance experiments, or in pre-clinical or clinical imaging systems. The RF pulse generator 14 may be configured to produce selected pulse sequences having any desired characteristics. Although the area 24 is only shown as being sufficient to encompass the reaction chamber 18, it should be appreciated that the applied magnetic field (B1) also may encompass some or all of a reactant reservoir 16 and/or a valve assembly 20. As discussed below, the RF pulse generator 14, and the pulses generated thereby, may be selectively controlled by a controller.

The reservoir 16 may be any suitable device adapted to contain fluids, such as chemical reactants for a polarization reaction. The reservoir 16 may be made of any suitable materials consistent with this function including, but not limited to, plastic, aluminum, copper, zinc, tin, glass, stainless steel, or combinations thereof. In some embodiments, the reservoir 16 may be made of materials that are non-reactive with the intended contents of the reservoir 16. In some embodiments, the reservoir 16 may be made of non-magnetic materials, so that it may be safely positioned with the static (B0) and/or applied (B1) magnetic field(s). The reservoir 16 may have a fixed or a variable-volume. The reservoir 16 may be selectively configured to be in fluid communication with the valve assembly 20. In some embodiments, the reservoir 16 may comprise a piston, such as a mechanically-actuated or fluid-actuated piston, which, when actuated, may cause fluids within the reservoir 16 to be "injected" into the valve assembly 20 when the reservoir 16 is in fluid communication therewith. In some embodiments, the contents of reservoir 16 may be evacuated by air that is injected into the reservoir, such as via a port in the side of the reservoir 16. The reservoir 16 optionally may be a reservoir assembly 30 (See, e.g., FIG. 3) comprising a plurality of reservoirs 16, each independently configured to contain a fluid, such as a chemical reactant for a polarization reaction. In some embodiments, each of reservoirs 16 in the reservoir assembly 30 may be selectively configured to be in fluid communication with the valve assembly 20, such that fluids may be selectively injected from each reservoir 16 into the valve assembly 20. In some embodiments, a reservoir assembly 30 may be configured so that the contents of each reservoir 16 are sequentially injected into the valve assembly 20, similar to the chambers of a revolver. As discussed below, the various selective operations of the reservoir 16 and/or the reservoir assembly 30 may be controlled by a controller.

The reaction chamber 18 may be any suitable device adapted to contain fluids, such as a mixture of chemical reactants for a polarization reaction. The reaction chamber 18 may be made of any suitable materials consistent with this function including, but not limited to, plastic, glass, aluminum, or combinations thereof. Because the reaction chamber 18 is positioned with a strong magnetic field, it may made of a nonmagnetic material. In some embodiments, the reaction chamber 18 may be made of materials that are non-reactive with the intended contents of the reaction chamber 18. The reaction chamber 18 may have a fixed or a variable-volume. The reaction chamber 18 may be selectively configured to be in fluid communication with the valve assembly 20, such that it can receive fluids from, or divert fluids to the valve assembly 20. In some embodiments, the reaction chamber 18 may comprise a piston, such as a mechanically-actuated or fluid-actuated piston, which, when actuated, may cause fluids within the reaction chamber 18 to be "injected" into the valve assembly 20 when the reaction chamber 18 is in fluid communication therewith. Within the reaction chamber 18, the piston action may efficiently refresh the walls of the reaction chamber for the subsequent reaction cycle, resulting in increased output efficiency (i.e., fewer precursor molecules remaining on the walls). In some embodiments, the contents of the reaction chamber 18 may be evacuated by air that is injected into the reaction chamber 18, such as via a port. The reaction chamber 18 optionally may be a reaction chamber assembly 32 (See, e.g., FIG. 3) comprising a plurality of reaction chambers 18, each independently configured to contain a fluid, such as a mixture of reactants for a polarization reaction. In some embodiments, each of reaction chambers 18 in the reaction chamber assembly 32 may be selectively configured to be in fluid communication with the valve assembly 20, such that fluids may be selectively injected into or from each reaction chamber 18. As discussed below, the various selective operations of the reaction chamber 18 and/or the reaction chamber assembly 32 may be controlled by a controller.

Figure 2:
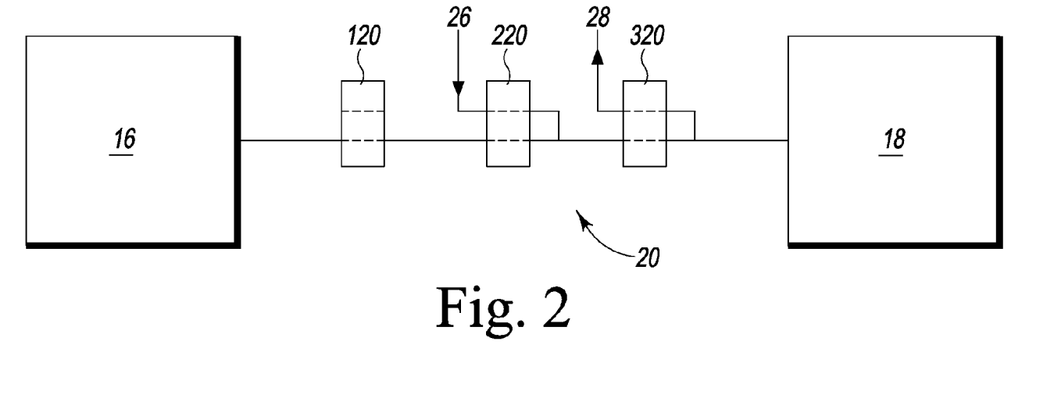
FIG. 2 is a block diagram of an exemplary embodiment of a reactor assembly.
Figure 3:
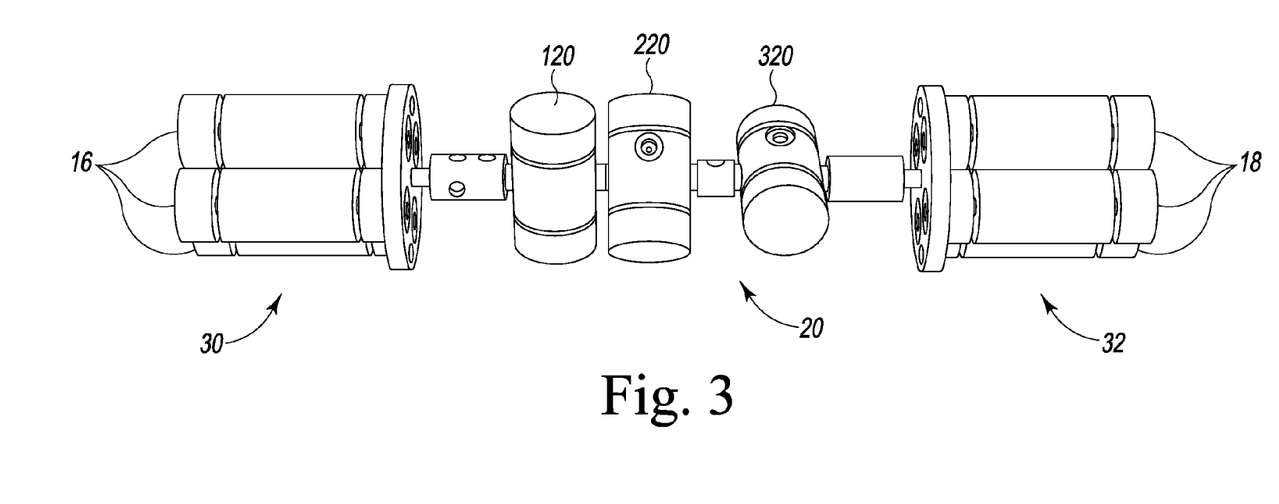
FIG. 3 is a side view of an exemplary embodiment of a reactor assembly.

The valve assembly 20 may comprise one or more conduits connecting the various components of reactor 10, and one or more valves for selectively providing fluid communication between the various components of reactor 10. The valve assembly 20 may be made of any suitable materials consistent with these functions, including, but not limited to, plastic, aluminum, stainless steel, or combinations thereof. In some embodiments, the components of the valve assembly 20 may be made entirely of non-magnetic materials, so that the valve assembly 20 may be safely positioned within the static (B0) and/or applied (B1) magnetic field(s). For example, as shown in FIGS. 2-3, some valve assemblies 20 may comprise a first valve 120, a second valve 220, and a third valve 320, although any number of valves may be used to selectively provide fluid communication between the various components of a reactor 10, as desired. The first valve 120 may be in fluid communication with the reservoir 16 and the second valve 220, and may be adapted to provide fluid communication between the reservoir 16 and the second valve 220 when in a first or "on" configuration and may be adapted to prevent fluid communication between the reservoir 16 and the second valve 220 when in a second or "off" configuration. The second valve 220 may be in fluid communication with the first valve 120, the third valve 320, and an external source 26. The second valve 220 may be adapted to provide fluid communication between the first valve 120 and the third valve 320 and to prevent fluid communication between the external source 26 and the third valve 320 when in a first configuration. The second valve may be adapted to prevent fluid communication between the first valve 120 and the third valve 320, and to provide fluid communication between the external source 26 and the third valve 320, when in a second configuration. The third valve 320 may be in fluid communication with the second valve 220, the reaction chamber 18, and an output 28. The third valve 320 may be adapted to provide fluid communication between the second valve 220 and the reaction chamber 18 and to prevent fluid communication between the reaction chamber 18 and the output 28 when in a first configuration. The third valve 320 may be adapted to prevent fluid communication between the second valve 220 and the reaction chamber 18 and to provide fluid communication between the reaction chamber 18 and the output 28 when in a second configuration. The first valve 120, second valve 220, and third valve 320 may be adapted to work in concert to provide fluid communication between the reservoir 16 and the reaction chamber 18, between the external source 26 and the reaction chamber 18, and between the reaction chamber 18 and the output 28. As discussed below, the various selective operations of the valve assembly 20 may be controlled by a controller.

One or more controllers, or a control system, may be used to control one or more of the various components of the reactor 10. For example, a controller may be used to selectively actuate and/or control one or more of the magnet 12, the RF Pulse generator 14, the reservoir 16, the reaction chamber 18 and the valve assembly 20. The controller may be manually or automatically operated, and may be operated with various programs for conducting any desired reaction. For example, the various components of the reactor assembly may be controlled centrally from a computer, an NMR spectrometer, or any other suitable control system.

In some reactors 10, the reaction chamber 18, valve assembly 20, and reservoir 16 may be constructed as an integral unit. Each of the reaction chamber 18, valve assembly 20, and reservoir 16 may be non-magnetic, and may be located within the static magnetic field (B0) when the field is being generated by the magnet 12. This permits for substantially decreased dead-volume, and the concomitant advantages that that entails. FIG. 3 shows an exemplary reactor assembly 10 that is constructed as an integral unit.

Polarizer valves generally must be configured to withstand high pressures, due to the high rates at which reactants must flow through the valves when being delivered to and from the various reactant reservoirs and reactions chambers. Specifically, polarizer valves must be able to withstand pressures of at least about 500 psi, such as pressures of at least about 600 psi, 700 psi, 800 psi, 900 psi, or 1000 psi, among others. Existing polarizers utilize solenoid valves due, at least in part, to their ability to withstand these high pressures. However, as discussed above, solenoid valves present a number of problems. First, exposing polarized chemicals to the magnetic fields generated by the components of a solenoid valve may adversely affect the polarization of the chemicals. Second, solenoid valves cannot be positioned in close proximity to the magnetic fields generated by a polarizer, because the magnetic fields will affect their function, and will pose a projectile hazard. Other valves are either incapable of withstanding these high pressures, or are made substantially of magnetic or magnetizable materials.

Figure 4:
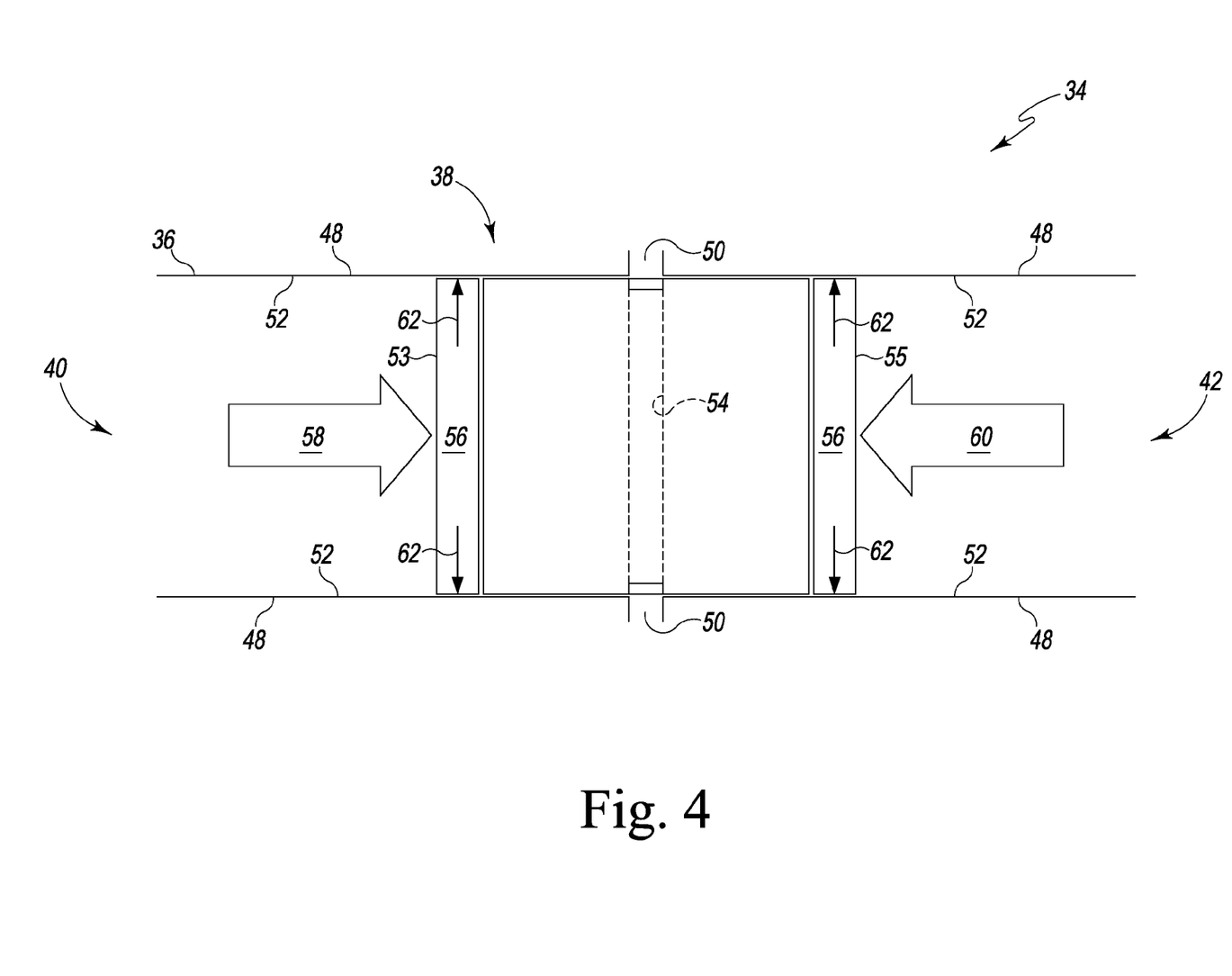
FIG. 4 is a schematic side view of a valve.

Valve assemblies 20 formed of nonmagnetic materials, which would permit users to position the valve assembly within a magnetic field to reduce dead-volume, require specialized valves made of non-magnetic materials while still being capable of withstanding the high pressures necessary to deliver reactants to a polarization reactor. FIG. 4 shows a non-limiting schematic representation of such a valve 34, which includes a housing 36 defining an internal space, and a piston assembly 38 positioned within the space and movable between a plurality of positions relative to the housing 36.

The housing 36 may be made of any suitable materials consistent with it functions. For example, the housing 36 may be made entirely of non-magnetic materials so that the valve 34 may be safely positioned with the static (B0) and/or applied (B1) magnetic field(s), while still being able to function properly. Exemplary materials include, but are not limited to, plastic, aluminum, copper, zinc, tin, glass, or combinations thereof. The housing 36 may be cylindrical. The housing 36 may include a first end 40 a second end 42 opposite the first end, a plurality of openings and an inner wall 52. For example, the housing 36 may have a first opening 44 at the first end 40 and a second opening 46 at the second end 42. The housing 36 also may have a side 48 with at least one opening 50 in the side 48. For example, as shown in FIGS. 5-8, the housing may include one or more of a third opening 350, a fourth opening 450, a fifth opening 550, and a sixth opening 650

Figure 5:
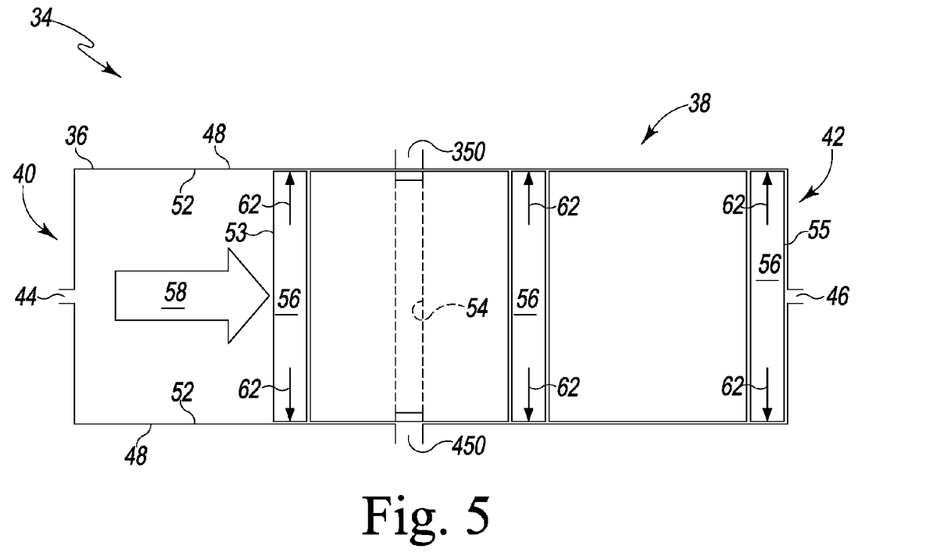
FIG. 5 is a schematic side view of an on/off valve in a first "on" position.
Figure 6:
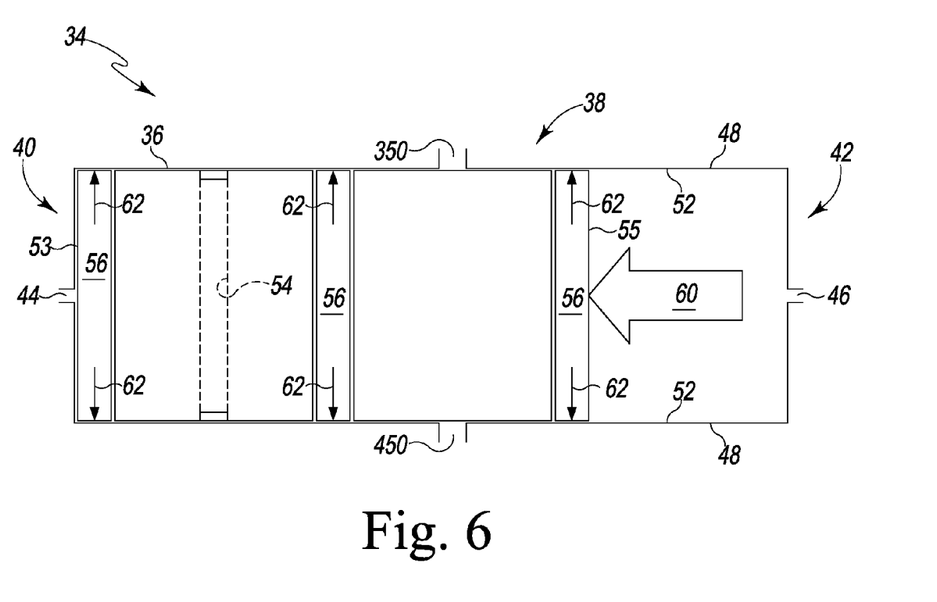
FIG. 6 is a schematic side view of an on/off valve in a second "off" position.
Figure 7:
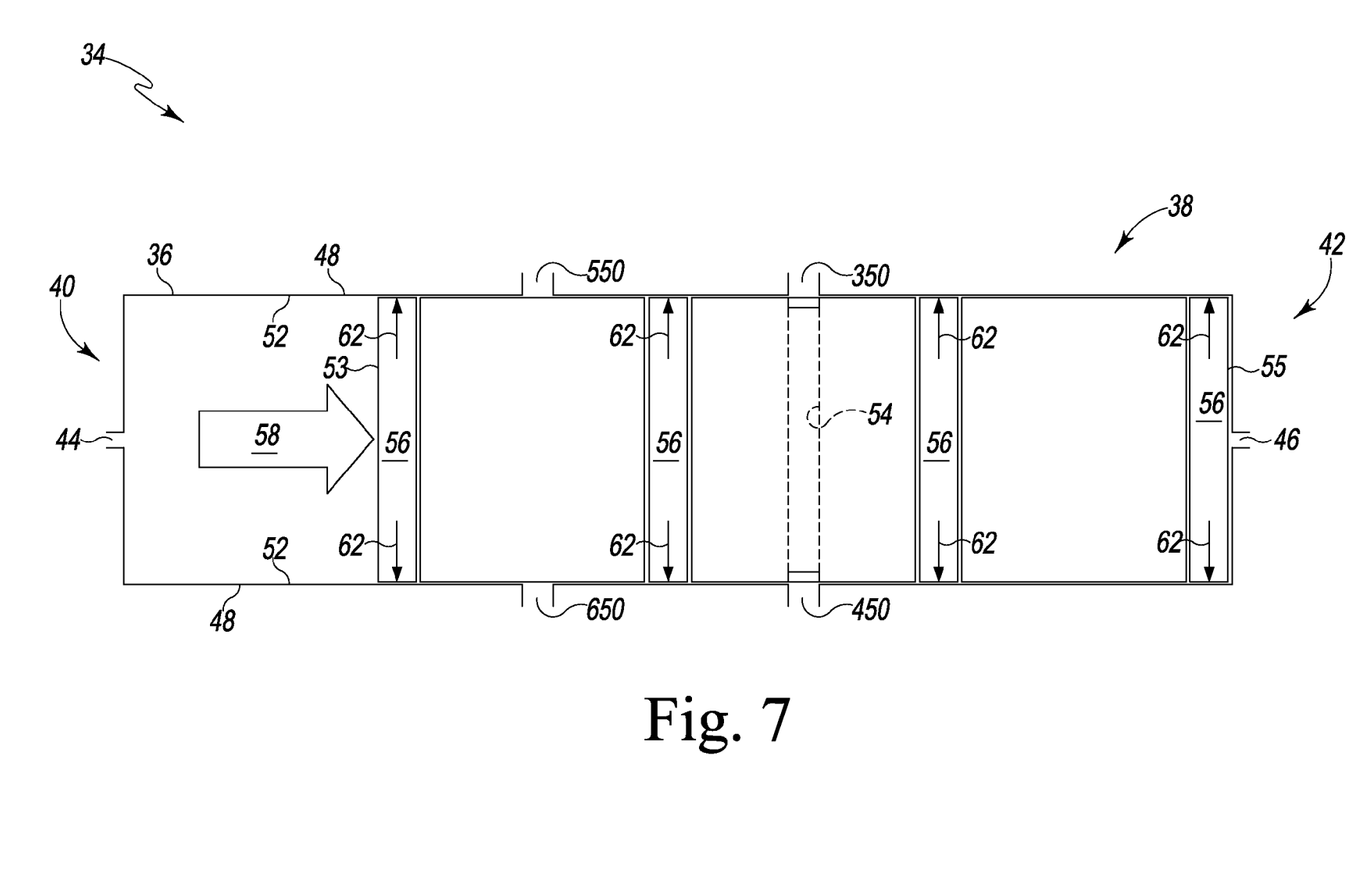
FIG. 7 is a schematic side view of an either/or valve in a first position.
Figure 8:
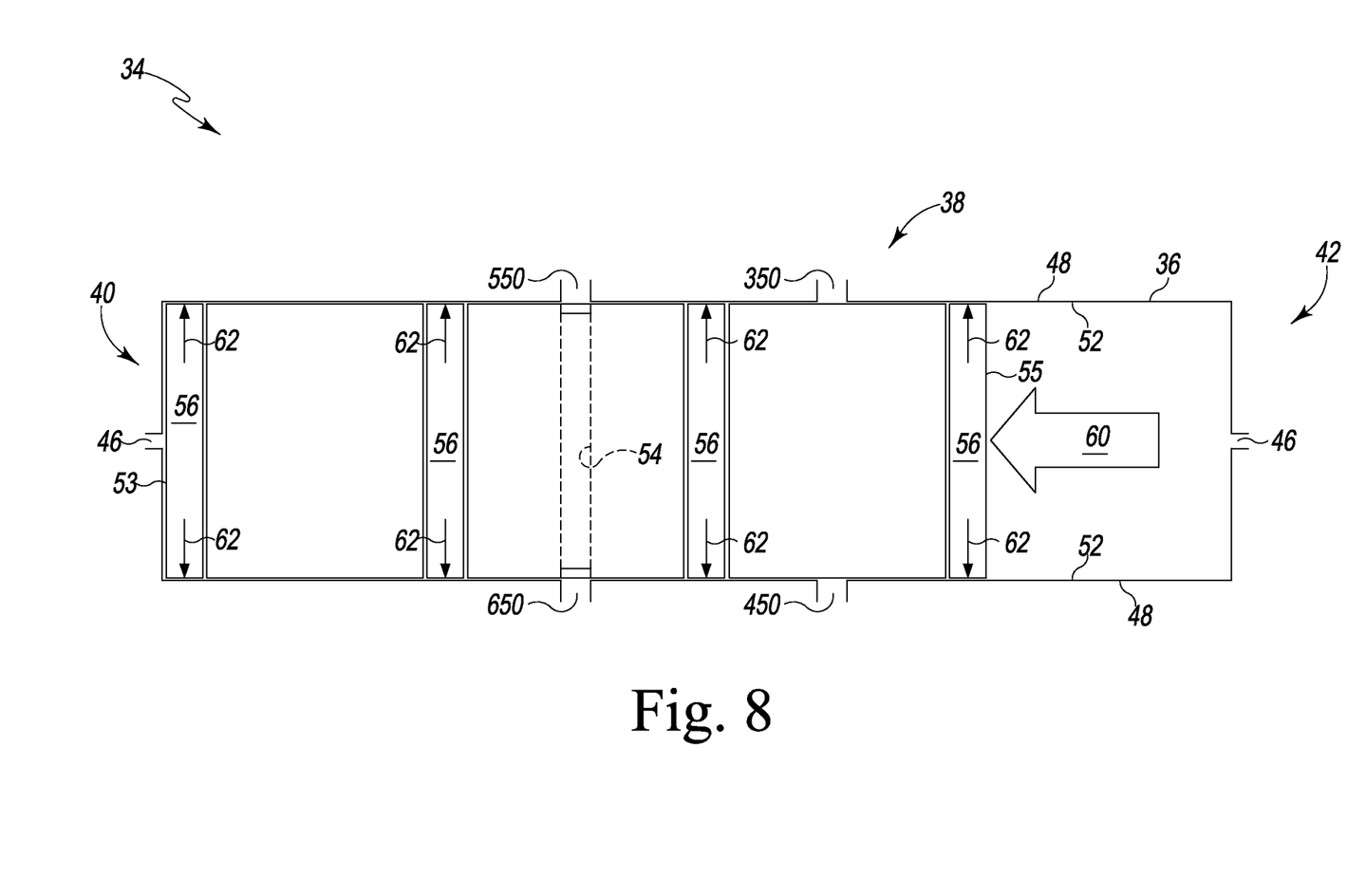
FIG. 8 is a schematic side view of an either/or valve in a second position.

The piston assembly 38 also may be made entirely of non-magnetic materials including, but not limited to, plastic, aluminum, copper, zinc, tin, glass, or combinations thereof. The piston assembly 38 may comprise a first end 53, a channel 54, a second end 55 and at least a pair of sealing members 56, one on either side of the channel. The piston assembly 38 may be configured to reciprocate back and forth within the housing 36 between extreme positions, where either the first end 53 of the piston assembly 38 engages the first end 40 of the housing 36, or the second end 55 of the piston assembly 38 engages the second end 42 of the housing 36. The channel 54, which may be a hole, aperture, gap, slit, opening or other similar structure for directing fluids, may be adapted to be aligned with, and thereby provide fluid communication between, a pair of openings 50 in the housing 36 when the piston assembly is in a particular extreme position relative to the housing 36. For example, as shown in FIGS. 5 and 6, the channel 54 may be adapted to be aligned with openings 350 and 450 when the piston assembly 38 is in a first position (FIG. 5), but may be unaligned with openings 350 and 450 when the piston assembly is in a second position (FIG. 6). Likewise, as shown in FIGS. 7 and 8, the channel 54 may be adapted to be aligned with openings 350 and 450 when the piston assembly 38 is in a first position (FIG. 7), and may be aligned with openings 550 and 650 when the piston assembly 38 is in a second position (FIG. 8).

At least a portion of each sealing member 56 may be configured to move (e.g., to translate, expand, deform etc.) in direction 62 toward and against the inner wall 52 of the housing 36 in response to a net compression force on opposite ends 53 and 55 of the piston assembly 38, thereby causing the sealing members to produce a seal with the inner wall 52 of the housing 36. The sealing members 56 thus may be adapted to prevent or inhibit fluids from flowing between the sealing members and the inner wall 52 of the housing 36. For example, as shown in FIG. 4, a first force 58 may be applied to the first end 53 of the piston assembly 38, and a second force 60 may be applied to the second end 55 of the piston assembly 38. The first and second forces 58 and 60 may be applied with either a solid object or a fluid, such as air or a hydraulic liquid, and may combine to produce a net compression force on the piston assembly 38 that causes the sealing members 56 to form a seal with the inner wall 52. Each sealing member may engage the inner wall of the housing with a force having a magnitude that is proportional to the magnitude of the compressive force applied to the first and second ends. The sealing members 56 thus may prevent fluid communication between openings in the ends 40 and 43 of the housing 36 and openings in the side 48 of the housing 36 during operation of the valve. The sealing members also may be configured to engage the inner wall of the housing, during translation of the piston assembly between the first and second position, with sufficient force to wipe liquids from the inner wall of the housing, but with insufficient force to prevent translation of the piston assembly.

FIGS. 5 and 6 show a non-limiting schematic representation of an on/off valve in a first "on" configuration (FIG. 5) and a second "off" configuration (FIG. 6). As discussed above, the housing 36 may comprise a third opening 350 and a fourth opening 450 located in the side 48 of the housing 36. The piston assembly 38 may comprise a channel 54 adapted to provide fluid communication between the third opening 350 and fourth opening 450 when the piston assembly 38 is in the first "on" position (FIG. 5). However, the piston assembly 38 may be configured to prevent fluid communication between the third opening 350 and fourth opening 450 when it is in the second "off" position (FIG. 6).

For example, as shown in FIG. 5, a fluid may be injected through the opening 44 in the first end 40 of the housing 36, thereby applying a first force 58 to the first end 53 of the piston assembly 38 that urges the piston assembly 38 to move away from the first end 40 until the second end 55 of the piston assembly 38 engages the second end 42 of the housing 36. At this point, the piston assembly 38 is in the first "on" position, with the channel 54 providing fluid communication between the third and fourth openings 350 and 450. The first force 58 combines with the force applied by the second end 42 of the housing 36 to produce a net compression force on the piston assembly 38 that causes the sealing members 56 to move in direction 62 and create a seal with the inner wall 52 of the housing 36. This seal prevents or inhibits fluids (e.g., fluids being injected through opening 44 or fluids flowing through the channel 54) from passing between the sealing members 56 and the inner wall 52 of the housing 36.

As shown in FIG. 6, a fluid also may be injected through opening 46, thereby applying a second force 60 to the second end 55 of the piston assembly 38 that urges the piston assembly 38 to move away from the second end 42 until the first end 53 of the piston assembly 38 engages the first end 40 of the housing 36. At this point, the piston assembly is in the second "off" position, with the channel 54 unaligned with the third and fourth openings 350 and 450. The second force 60 combines with the force applied by the first end 40 to produce a net compression force on the piston assembly 38 that causes the sealing members 56 to move in direction 62 and create a seal with the inner wall 52. This seal prevents or inhibits fluids from passing between the sealing members 56 and the inner wall 52 of the housing 36. Moreover, the piston assembly 38 prevents fluid communication between the third opening 350 and fourth opening 450.

FIGS. 7 and 8 show a non-limiting schematic representation of an either/or valve in a first configuration (FIG. 7) and a second configuration (FIG. 8). As discussed above, the housing 36 may comprise a third opening 350, a fourth opening 450 a fifth opening 550 and a sixth opening 650, each located in the side 48 of the housing 36. The piston assembly 38 may comprise a channel 54 adapted to provide fluid communication between the third and fourth openings 350 and 450 when the piston assembly 38 is in the first position (FIG. 7), and to provide fluid communication between the fifth and sixth openings 550 and 650 when the piston assembly 38 is in the second position (FIG. 8).

Similar to the exemplary valve shown in FIGS. 5 and 6, the valve of FIGS. 7 and 8 may have a piston assembly that is reciprocally actuated by a fluid. As shown in FIG. 7, a fluid may be injected through the opening 44 in the first end 40 of the housing 36, thereby applying a first force 58 to the first end 53 of the piston assembly 38 that urges the piston assembly 38 to move away from the first end 40 until the second end 55 of the piston assembly 38 engages the second end 42 of the housing 36. At this point, the piston assembly 38 is in the first position, with the channel 54 aligned with, and providing fluid communication between, the third and fourth openings 350 and 450. When in the first position, the channel 54 is unaligned with, and prevents fluid communication between the fifth and sixth openings 550 and 650. The first force 58 combines with the force applied by the second end 42 of the housing 36 to produce a net compression force on the piston assembly 38 that causes the sealing members 56 to move in direction 62 and create a seal with the inner wall 52 of the housing 36. This seal prevents or inhibits fluids (e.g., fluids being injected through opening 44, fluids flowing through the channel 54, etc.) from passing between the sealing members 56 and the inner wall 52 of the housing 36.

As shown in FIG. 8, a fluid also may be injected through opening 46, thereby applying a second force 60 to the second end 55 of the piston assembly 38 that urges the piston assembly 38 to move away from the second end 42 until the first end 53 of the piston assembly 38 engages the first end 40 of the housing 36. At this point, the piston assembly 38 is in the second position, with the channel 54 aligned with, and providing fluid communication between, the fifth and sixth openings 550 and 650. The channel 54 also is unaligned with, and prevents fluid communication between the third and fourth openings 550 and 650. The second force 60 combines with the force applied by the first end 40 to produce a net compression force on the piston assembly 38 that causes the sealing members 56 to move in direction 62 and create a seal with the inner wall 52. This seal prevents or inhibits fluids from passing between the sealing members 56 and the inner wall 52 of the housing 36.

Figure 9:
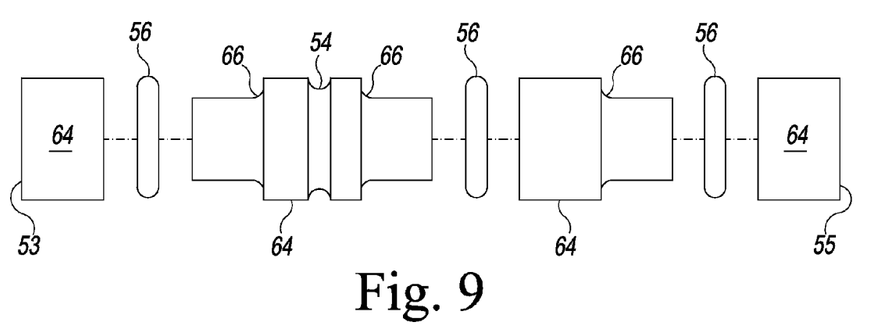
FIG. 9 is an exploded side view of an exemplary piston assembly.
Figure 10:
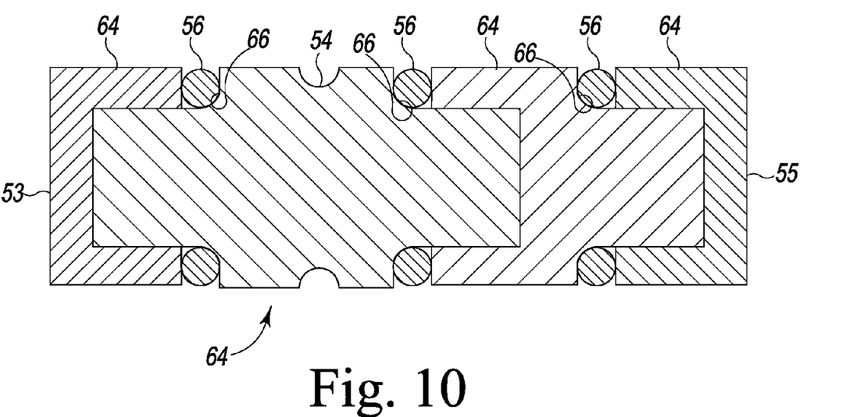
FIG. 10 is an assembled side view of the piston assembly of FIG. 9.
Figure 11:
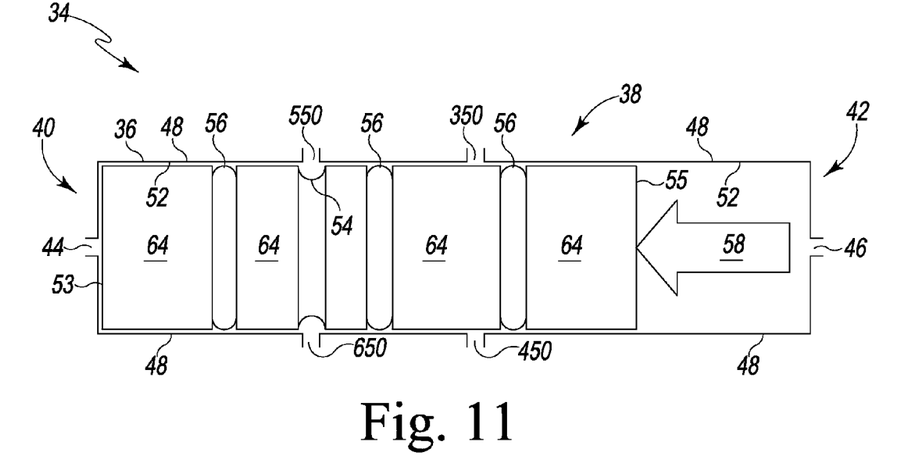
FIG. 11 is cross-sectional side view of a valve including the piston assembly of FIG. 9 within an exemplary housing.

FIGS. 9-11 show an exemplary piston assembly 38, with the assembly shown in an exploded side view (FIG. 9), an assembled side view (FIG. 10) and a cross-sectional side view within a housing (FIG. 11). The piston assembly 38 may comprise multiple piston members 64 and sealing members 56. These piston members may or may not be securely attached to one another (e.g., via threading). For example, the piston members may loosely engage one another but may be held together by the various forces present within the housing. When used with a cylindrical housing, the fully assembled piston assembly 38 may be substantially cylindrical in shape, and may be adapted to cause the sealing members to move towards the inner wall of the housing when a net compression force is applied to opposite ends of the piston assembly. The sealing members may be O-rings or any other suitable structure that can be moved towards the inner wall of the housing upon application of a net compressive force to opposite ends of the piston assembly. For example, as best shown in FIG. 9, some piston assembly may include a curved edge 66 adjacent to and corresponding to each sealing member (e.g., on an adjacent piston member), where application of a net compressive force to the ends of the piston assembly causes each sealing member to engage the corresponding curved edge. The curved edge, in turn, forces the sealing member to move toward the inner wall of the housing.

Figure 12:
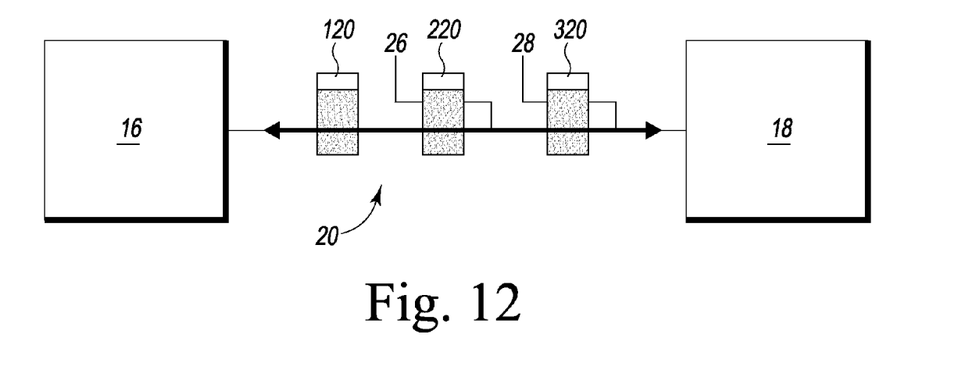
FIG. 12 is a flow diagram showing an exemplary reactor assembly having a valve assembly configured to provide fluid communication between a reservoir and a reaction chamber.
Figure 13:
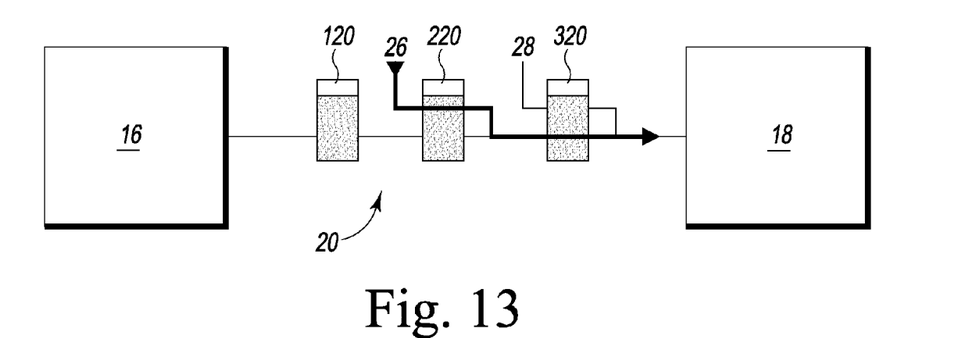
FIG. 13 is a flow diagram showing the reactor assembly of FIG. 12, where the valve assembly is configured to provide fluid communication between an external source and the reaction chamber.
Figure 14:
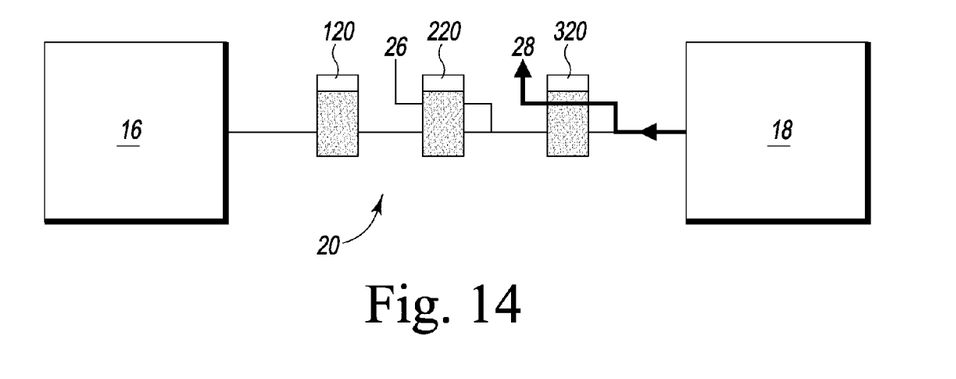
FIG. 14 is a flow diagram showing the reactor assembly of FIG. 12, where the valve assembly is configured to provide fluid communication between the reaction chamber and an output.

FIGS. 12-14 show an exemplary reactor assembly 10 in various operational states. Similar to the exemplary reactor assembly of FIGS. 2-3, the reactor assembly of FIGS. 12-14 may include a first valve 120, a second valve 220 and a third valve 320, although any suitable arrangement of valves may be used. The first valve 120 may be an on/off valve (such as is exemplified in FIGS. 5-6), and the second and third valves 220 and 320 may be either/or valves (such as is exemplified in FIGS. 7-8).

FIG. 12 shows a flow diagram of the reactor assembly 10 configured to direct fluid from the reservoir 16 to the reaction chamber 18. The first valve 120 (i.e., the on/off valve) may be configured in the first "on" configuration, while the second and third valves 220 and 320 each may be configured in first configurations. This overall arrangement of valves may establish fluid communication between the reservoir 16 and reaction chamber 18, such that actuation of a piston within the reservoir 16 injects fluid (e.g., a reactant for forming a contrast agent) from the reactant reservoir 16 into and through the valve assembly, and into the reaction chamber 18.

FIG. 13 shows a flow diagram of the reactor assembly 10 configured to direct fluid from an external source 26 to the reaction chamber 18. The first valve 120 may be in any configuration. The second valve 220 may be configured in the second configuration and the third valve may be configured in the first configuration, thereby establishing fluid communication between the external source 26 and the reaction chamber 18. Introduction of a positive pressure of a fluid species, retraction of the piston located within the reaction chamber 18, or a combination of both, may transport some amount of a fluid species (e.g., enriched parahydrogen gas) to the reaction chamber.

FIG. 14 shows a flow diagram of the reactor assembly 10 configured to direct fluid from the reaction chamber 18 to an output 28. The first valve 120 and second valve 220 may be in any orientation, while the third valve 320 may be configured in the second configuration, thereby establishing fluid communication between the reaction chamber 18 and the output 28. Actuation of the piston in the reaction chamber injects fluids from within the reaction chamber into and through the valve assembly and out through the output 28.

Those skilled in the art should appreciate that, for the fluid actuated valves described above, pressurized fluids selectively may be delivered to the openings 44 and 46 of the valves through a remote valve network, which in turn may be controlled by a controller. The reactor assembly may be fluidly connected to the remote valve network via any suitable conduits, such as flexible or rigid tubing, hoses and/or piping. For example, in some embodiments, the conduits may include 1/8" outer diameter Teflon or PTFE tubing. The remote valve network may be positioned at a large distance from the static (B0) and applied (B1) magnetic fields such that they can include solenoid valves and/or other valves having magnetic and/or magnetizable components.

The number of reservoirs 16, reaction chambers 18, and valves 34 within the reactor assembly 10 may only be limited by machine tolerances. For example, in a 2" device with traditional end-mills, 0.005" tolerance implies that piston diameters could be reduced to 0.100", and laser lithography could be used to reduce tolerances further. If several reactions are carried out in multiple parts, each reactor assembly could hold as many as 3, 4, 5, 6, 7, 8, 9, 10, or more reservoirs 16, reaction chambers 18, and/or valves 34. Complexity of pistons and cylinder arrangements can be accommodated either in columns, rows, concentric, partially overlapping or combinations thereof. In some embodiments, operational robustness may increase proportionally with the pressure ratings of the piston assemblies. Custom pistons with adjustable wipers may be designed for tuning the pressure holding capabilities of the respective chambers against system responsiveness. In some embodiments, a piston assembly 38 may serve as the custom piston and a sealing member 56 may serve as the adjustable wiper. Low pressure ratings may enable faster cycles but may make the hydraulic forces dependent and thus may require careful tuning of the chamber inputs. In some embodiments, the piston wipers on each end of the piston assembly may be internally lubricated from the hydraulic inputs. These wipers can be standard O-rings, with hardness between 75-90 on the Shore scale depending on operating pressure and system response requirements. In some embodiments, the O-rings may be 1/4" ID and 3/8" OD. In some embodiments, the dead-volume available from the surface area which encompasses the space between wipers may be small compared to the reactor volume.

Components of the present invention can be combined in increasingly complex circuits depending on experimental demands.

The reactor assembly of this disclosure may find application as a component of a bench-top cellular metabolic profiler, in bench-top analysis of cellular metabolism, in chemical catalysis experiments performed in high resolution spectrometers, or generally in applications which require portability, such as, for example, for use in production of contrast agents in a clinical setting. The reactor assembly may be a self-contained, portable device. In some embodiments, a portable reactor assembly may be used to perform para-hydrogen reactions at zero/Earth's field up to infinite field strength. In some embodiments, a reactor assembly may be used for studying homogeneous or heterogeneous catalysis and hydrogenation, for studying magnetic properties of the molecular addition analogs to para-hydrogen singlet states or other pure NMR applications, for preclinical imaging of metabolism with major application in tumor metabolism, where aberrant metabolic machinery is well established (and successively imaged by DNP already), for clinical imaging of metabolism with major application to cancer as a more specific marker than PET, for materials science of porous media, for high-throughput assays of cellular metabolism, for fluid-dynamics studies with potential applications to imaging combustion, and as a noble gas polarizer with major application to Xenon polarization. Noble gas polarization uses very low fields, and the electric fields used to trigger valves can have an adverse affect on achievable polarization. Because the components of the reactor assembly located within the magnetic field are purely nonmagnetic, it may provide a streamlined assembly for fluid-flow (e.g., gas) in hyperpolarized noble gas production. The reactor assemblies are uniquely suited for transparent operation in high field scanners because all of the active components are non-magnetic. High field scanners are universally equipped with the hardware to trigger the required pneumatic inputs, to execute pulse sequences, and to acquire NMR signals. This arrangement allows end-users to harness already considerable investments in magnets and coils to perform PASADENA. In addition, hyperpolarized contrast agents can be produced in close proximity to their biological targets, which may result in decreased transfer times from contrast agent production to infusion.

The methods and apparatuses disclosed herein are not limited in their applications to the details of construction and the arrangement of components described herein. The methods and apparatuses are capable of other embodiments and of being practiced or of being carried out in various ways. Also it is to be understood that the phraseology and terminology used herein is for the purpose of description only, and should not be regarded as limiting. Ordinal indicators, such as first, second, and third, as used in the description and the claims to refer to various structures, are not meant to be construed to indicate any specific structures, or any particular order or configuration to such structures. All methods described herein can be performed in any suitable order unless otherwise indicated herein or otherwise clearly contradicted by context. The use of any and all examples, or exemplary language (e.g., "such as") provided herein, is intended merely to better illuminate the methods and apparatuses disclosed herein and does not pose a limitation on the scope of the methods and apparatuses unless otherwise claimed. No language in the specification, and no structures shown in the drawings, should be construed as indicating that any non-claimed element is essential to the practice of the methods and apparatuses disclosed herein.

Recitation of ranges of values herein are merely intended to serve as a shorthand method of referring individually to each separate value falling within the range, unless otherwise indicated herein, and each separate value is incorporated into the specification as if it were individually recited herein. For example, if a concentration, volume or the like range is stated as 1% to 50%, it is intended that values such as 2% to 40%, 10% to 30%, or 1% to 3%, etc., are expressly enumerated in this specification. These are only examples of what is specifically intended, and all possible combinations of numerical values between and including the lowest value and the highest value enumerated are to be considered to be expressly stated in this application.

Further, no admission is made that any reference, including any non-patent or patent document cited in this specification, constitutes prior art. In particular, it will be understood that, unless otherwise stated, reference to any document herein does not constitute an admission that any of these documents forms part of the common general knowledge in the art in the United States or in any other country. Any discussion of the references states what their authors assert, and the applicant reserves the right to challenge the accuracy and pertinency of any of the documents cited herein.

What is claimed is:

1. A reactor assembly comprising:
    a reservoir
    a reaction chamber;
    a valve assembly comprising at least one valve, wherein the valve assembly is adapted to selectively provide fluid communication between the reservoir and the reaction chamber and is adapted to withstand pressures of at least 500 psi;
    a magnet adapted to produce a static magnetic field having a magnitude of at least about 1 mT; and
    a radiofrequency pulse generator adapted to produce an applied magnetic field;
    wherein the reservoir, reaction chamber, and valve assembly are non-magnetic and are positioned within the static magnetic field when the magnet is producing the static magnetic field;
    wherein the reaction chamber is positioned within the applied magnetic field when the radiofrequency pulse generator is producing the applied magnetic field;
    wherein the at least one valve comprises a housing having an inner wall defining an internal space and a piston assembly positioned within the space and movable relative to the housing between a first position and a second position;
    wherein the housing comprises a first opening at a first end and a second opening at a second end opposite the first end;
    wherein the piston assembly translates to the first position in response to a first fluid pressure applied via the first opening; and
    wherein the piston assembly translates to the second position in response to a second fluid pressure applied via the second opening; and
    wherein the piston assembly further comprises a first end, a second end, a channel and at least one sealing member on each side of the channel, wherein the application of a net compressive force to the first and second ends causes at least a portion of each sealing member to move towards the inner wall of the housing, thereby preventing or inhibiting fluids from flowing between the sealing member and the inner wall of the housing.

2. The reactor assembly of claim 1, wherein the at least one valve comprises a spool valve.

3. The reactor assembly of claim 1, wherein the housing further comprises a third opening in fluid communication with the reaction chamber and a fourth opening in fluid communication with the reservoir,
    wherein the third opening and fourth opening are located in the side of the housing;
    wherein the piston assembly is adapted to provide fluid communication between the third opening and fourth opening when the piston assembly is in the first position; and
    wherein the piston assembly is adapted to prevent fluid communication between the third opening and fourth opening when the piston assembly is in the second position.

4. The reactor assembly of claim 1, wherein the housing further comprises a fifth opening in fluid communication with an external source or an output and a sixth opening in fluid communication with the reaction chamber,
    wherein the fifth opening and sixth opening are located in the side of the housing;
    wherein the piston assembly is adapted to provide fluid communication between the fifth opening and sixth opening when the piston assembly is in the second position; and
    wherein the piston assembly is adapted to prevent fluid communication between the fifth opening and sixth opening when the piston assembly is in the first position.

5. The reactor assembly of claim 1, wherein each sealing member engages the inner wall of the housing with a force having a magnitude that is proportional to the magnitude of the compressive force applied to the first and second ends.

6. The reactor assembly of claim 1, wherein during translation of the piston assembly between the first and second position, the at least one sealing member engages the inner wall of the housing with sufficient force to wipe liquids from the inner wall of the housing, but with insufficient force to prevent translation of the piston assembly.

7. The reactor assembly of claim 1, wherein the piston assembly further includes a curved edge adjacent to and corresponding to each sealing member, and wherein application of a net compressive force to the first and second ends causes each sealing member to engage the corresponding curved edge, which thereby forces the sealing member to move toward the inner wall of the housing.

8. The reactor assembly of claim 1, wherein the valve assembly is adapted to withstand pressures of at least 1000 psi.

9. The reactor assembly of claim 1, wherein the reservoir comprises a first piston, wherein the reaction chamber comprises a second piston, and wherein the first piston and second piston are fluid actuated.

10. The reactor assembly of claim 1, wherein the reservoir, reaction chamber, and valve assembly are plastic.

11. The reactor assembly of claim 1, wherein the valve assembly is adapted to channel fluids from the reservoir to the reaction chamber in less than about 1 second.

12. The reactor assembly of claim 1, comprising a plurality of valves.

\* \* \* \* \*

UNITED STATES PATENT AND TRADEMARK OFFICE
CERTIFICATE OF CORRECTION

Page 1 of 1

PATENT NO. : 9,452,409 B2
APPLICATION NO. : 14/113325
DATED : September 27, 2016
INVENTOR(S) : Kevin W. Waddell et al.

It is certified that error appears in the above-identified patent and that said Letters Patent is hereby corrected as shown below:

In the Specification

Column 1, Line 15:
Replace the paragraph: [[This invention was made with government support from a National Cancer Institutes P50 ICMIC (In Vivo Cellular and Molecular Imaging) career award with center number 1-04-065-9043. The United States federal government has certain rights in the invention.]]

With the paragraph: --This invention was made with government support under grant numbers CA128323 and CA136440 awarded by the National Institutes of Health. The government has certain rights in the invention.--

Signed and Sealed this
Twenty-third Day of March, 2021

Drew Hirshfeld
*Performing the Functions and Duties of the*
*Under Secretary of Commerce for Intellectual Property and*
*Director of the United States Patent and Trademark Office*